United States Patent
Haji

(10) Patent No.: US 6,432,751 B1
(45) Date of Patent: Aug. 13, 2002

(54) RESIN MOLD ELECTRIC PART AND PRODUCING METHOD THEREFOR

(75) Inventor: Hiroshi Haji, Chikushino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/031,919

(22) Filed: Feb. 27, 1998

(30) Foreign Application Priority Data

Apr. 11, 1997 (JP) .............................................. 9-093504

(51) Int. Cl.$^7$ .............................................. H01L 21/48
(52) U.S. Cl. ........................ 438/124; 438/126; 438/127
(58) Field of Search ................................ 438/106, 110, 438/112, 118, 127, 124, 126, 474; 257/787, 788; 29/841

(56) References Cited

U.S. PATENT DOCUMENTS

| | | | |
|---|---|---|---|
| 5,153,385 A | | 10/1992 | Juskey et al. ................ 174/260 |
| 5,252,181 A | * | 10/1993 | Dutartre et al. .............. 156/651 |
| 5,542,171 A | * | 8/1996 | Juskey et al. .................. 29/840 |
| 5,635,671 A | * | 6/1997 | Freyman et al. ............ 174/52.2 |
| 5,708,567 A | * | 1/1998 | Shim et al. ................... 361/723 |
| 5,780,933 A | * | 7/1998 | Ohmori et al. .............. 257/788 |
| 5,961,912 A | * | 10/1999 | Huang et al. ........... 264/272.15 |
| 5,963,792 A | * | 10/1999 | Wensel ........................ 438/106 |
| 6,117,708 A | * | 9/2000 | Wensel ........................ 438/118 |

FOREIGN PATENT DOCUMENTS

| | | | |
|---|---|---|---|
| JP | 5-235069 | * | 9/1993 |
| JP | 10-340977 | * | 12/1998 |

* cited by examiner

Primary Examiner—David L. Talbott
Assistant Examiner—Alonzo Chambliss
(74) Attorney, Agent, or Firm—Stevens, Davis, Miller & Mosher, LLP

(57) ABSTRACT

In an electronic part at least partially covered by a cured synthetic resin, an easy-and-secure partial removal of the synthetic resin from a surface portion of a substrate of the electronic part for obtaining a desired shape of the synthetic resin is brought about by treating the surface portion through sputtering or plasma before curing the synthetic resin on the surface portion.

13 Claims, 9 Drawing Sheets

RESIN MOLD ELECTRIC PART AND PRODUCING METHOD THEREFOR

BACKGROUND OF THE INVENTION AND RELATED ART STATEMENT

The present invention relates to an electric part at least partially covered by a synthetic resin and a producing method therefor.

In a prior art method for producing an electronic part as disclosed by Publication of U.S. Pat. No. 5,153,385, a sputter etched polyimide coat applied over the substrate improves an adhesion between a molding compound to the substrate.

OBJECT AND SUMMARY OF THE INVENTION

An object of the present invention is to provide an electric part partially covered by a synthetic resin, in which electric part the synthetic resin is easily and securely removed from a part of a substrate of the electronic part to obtain or leave a desired shape of the synthetic resin on the substrate and/or is securely fixed to another part of the substrate, and to provide a producing method for such electronic part.

According to the present invention in an electric part comprising, a substrate including an electrode, an electronic element chip arranged on the substrate and connected to the electrode, and a synthetic resin cover covering the electrode and the electronic element chip, the substrate has a first surface portion on which the synthetic resin cover is arranged, and a second surface portion on which the synthetic resin cover is prevented from being arranged, and the second surface portion is metallic and is formed or exposed through at least one of sputtering (including sputter etching) and plasma-treatment (for example, plasma-etching) to be prevented or restrained from including at least one of oxide and hydroxide.

Since the second surface portion on which the synthetic resin cover is prevented from being arranged is metallic and is formed or exposed before curing the synthetic resin thereon through at least one of sputtering, sputter etching and plasma-etching to be prevented or restrained from including at least one of oxide and hydroxide, a synthetic resin adhering to the second surface portion is easily and securely removed from the second surface portion so that a shape of the synthetic resin cover is desirably formed.

If the second surface portion abuts on the first surface portion or a metallic surface which includes the second surface portion and is prevented or restrained from including the at least one of oxide and hydroxide extends slightly as a part of the first surface portion under the synthetic resin cover, a relatively thin and/or narrow part of the synthetic resin on the second surface portion is easily, securely and correctly removed from a relatively thick and/or wide part of the synthetic resin on the first surface portion so that the shape of the synthetic resin cover is desirably formed on the first surface portion.

The substrate can include a gold layer whose thickness is less than 0.1 $\mu$m, for example, 0.03 $\mu$m, to form thereon the second surface portion.

The second surface portion is prevented or restrained from including the at least one of oxide and hydroxide through at least one of sputtering and sputter-or-plasma-etching of the second surface portion for removing the at least one of oxide and hydroxide from the second surface portion. The first surface portion is formed through at least one of sputtering and plasma-etching of a synthetic resin layer for deforming or removing locally the synthetic resin layer or refreshing-or-activating a surface of the synthetic resin layer, so that an adhering strength between the first surface portion and the synthetic resin cover is increased.

According to the present invention, in a method for producing an electric part, comprising the steps of: mounting an electronic element chip onto a substrate, curing a part of a synthetic resin on a first surface portion of the substrate to cover the electronic element chip, and another part of the synthetic resin on a second surface portion of the substrate along which the synthetic resin is supplied onto the first surface portion, and removing the another part of the synthetic resin from the second surface portion, the second surface portion is formed on a metallic layer through at least one of sputtering, sputter etching and plasma-etching for removing at least one of oxide and hydroxide from the metallic layer, before curing the synthetic resin on the substrate.

Since the second surface portion is formed on the metallic layer through at least one of sputtering, sputter etching and plasma-etching for removing at least one of oxide and hydroxide from the metallic layer before curing the synthetic resin on the substrate, the synthetic resin adhering to the second surface portion is easily and securely removed from the second surface portion so that the shape of the synthetic resin cover is desirably formed.

DETAILED DESCRIPTION OF PREFERRED EMBODIMENTS

Figure 1:
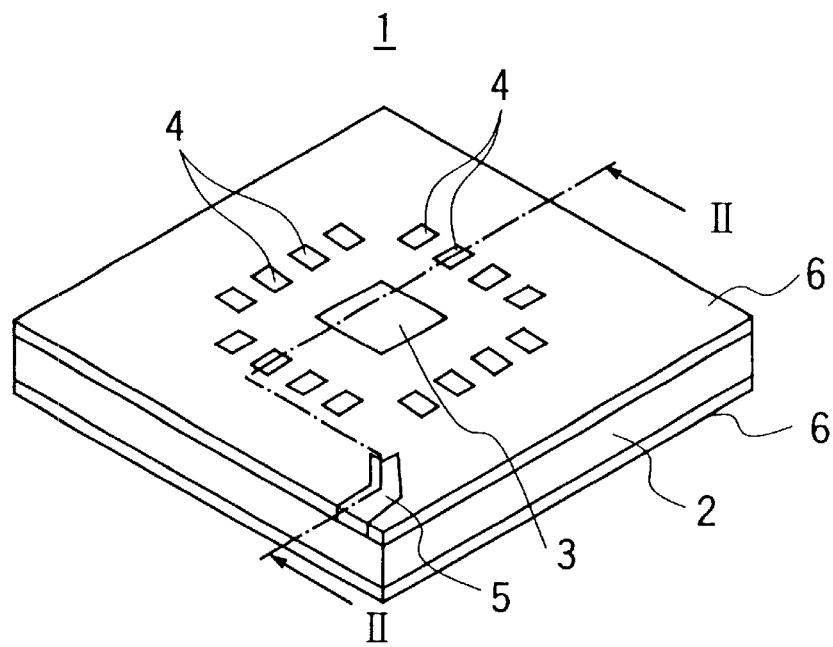
FIG. 1 is an oblique projection view showing a substrate used for the present invention.
Figure 2:
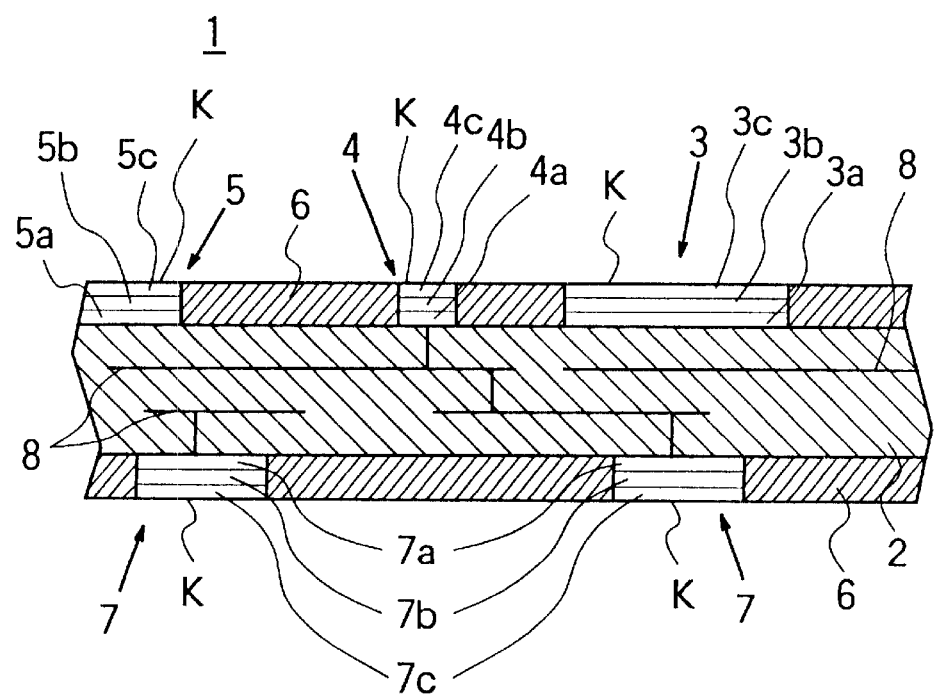
FIG. 2 is a cross sectional view of the substrate.

As shown in FIGS. 1 and 2, a substrate 1 includes a substrate body 2, a chip mounting portion 3, front electrodes 4, back electrodes 7, a metallic layer 5, and an etching-resistant layers 6 of, for example, filler containing epoxy resin surrounding the chip mounting portion 3, the front electrodes 4, the back electrodes 8, the metallic surface 5. The front electrodes 4 are connected to the back electrodes 7 by inner electrically conductive elements 8. The chip mounting portion 3, the front and back electrodes 4 and 7, and the metallic surface 5 are formed on respective gold layers 3c, 4c, 7c and 5c, the gold layers 3c, 4c, 7c and 5c are formed on respective nickel layers 3b, 4b, 7b and 5b, and the nickel layers 3b, 4b, 7b and 5b are formed on respective copper layers 3a, 4a, 7a and 5a. These layers and the inner electrically conductive elements 8 are stacked through plating and etching steps.

At least one of nickel oxide, nickel hydroxide and copper oxide K is formed on the chip mounting portion 3, the front and back electrodes 4 and 7, and the metallic surface 5 with a diffusion of at least one of the nickel and copper through the gold layer and/or the nickel layer. The at least one of nickel oxide, nickel hydroxide and copper oxide K deteriorates an easy removal of a cured synthetic resin from the metallic surface 5, in other words, adheres strongly to the synthetic resin. Therefore, the at least one of nickel oxide, nickel hydroxide and copper oxide K should be removed from the metallic surface 5 on which an undesirable part of the synthetic resin is cured.

Figure 3:
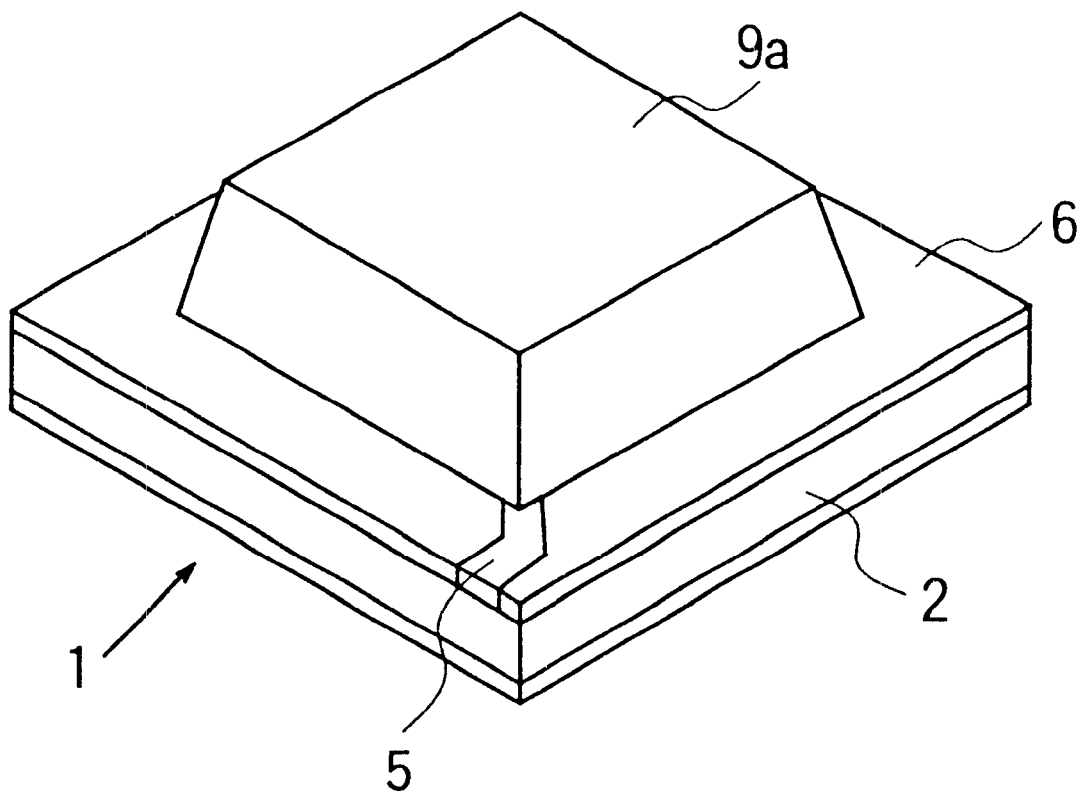
FIG. 3 is an oblique projection view showing an electric part of the present invention.

As shown in FIG. 3, a synthetic resin cover 9a of, for example, filler containing epoxy resin, is arranged on the substrate 1 to form an electric part 10 by flowing the synthetic resin along the metallic surface 5 before curing the synthetic resin. The undesirable part of the cured synthetic resin is removed from the metallic surface 5. The cured synthetic resin adheres to the etching-resistant layer 6.

Figure 4:
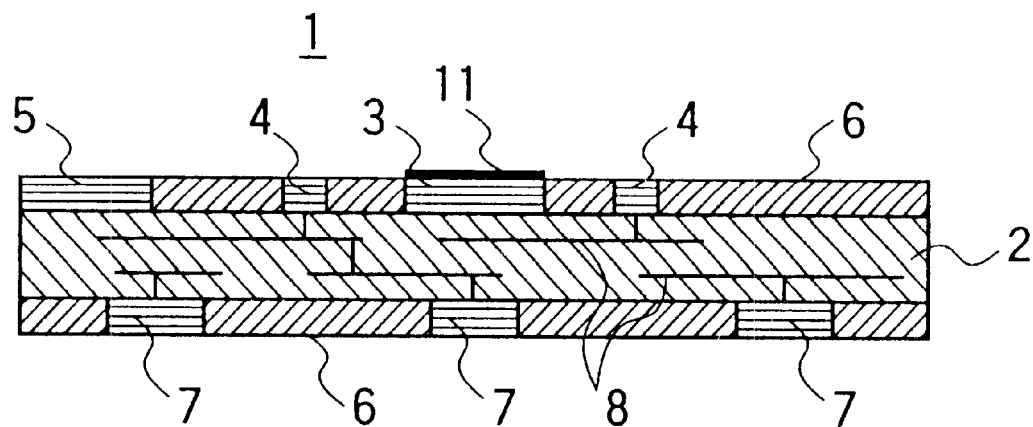
FIG. 4 is a cross sectional view of the substrate before mounting an electronic element chip on the substrate.
Figure 5:
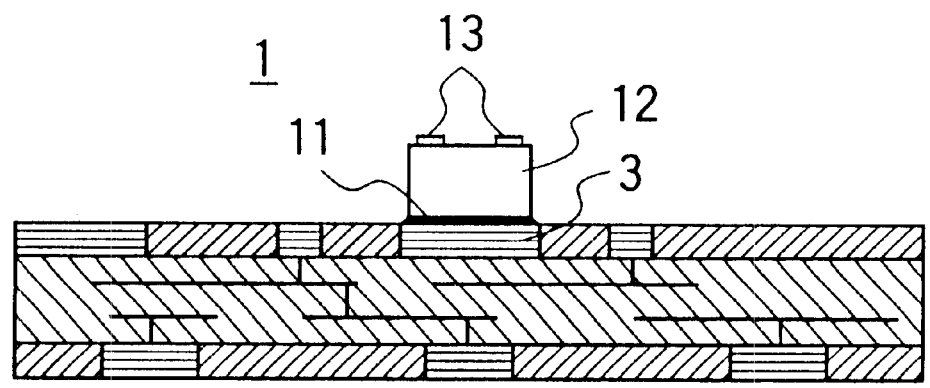
FIG. 5 is a cross sectional view of the substrate after mounting the electronic element chip on the substrate.

A method for producing the electric part is explained on FIGS. 4–10. As shown in FIG. 4, a bonding element 11 is arranged on the chip mounting portion 3. As shown in FIG. 5, an electronic element chip 12 with chip electrodes 13 is mounted on the bonding element 11, and the bonding element 11 is cured by heating the substrate 1. The heat of the substrate 1 accelerates a generation of the at least one of nickel oxide, nickel hydroxide and copper oxide K on the front and back electrodes 4 and 7, and the metallic surface 5.

Figure 6:
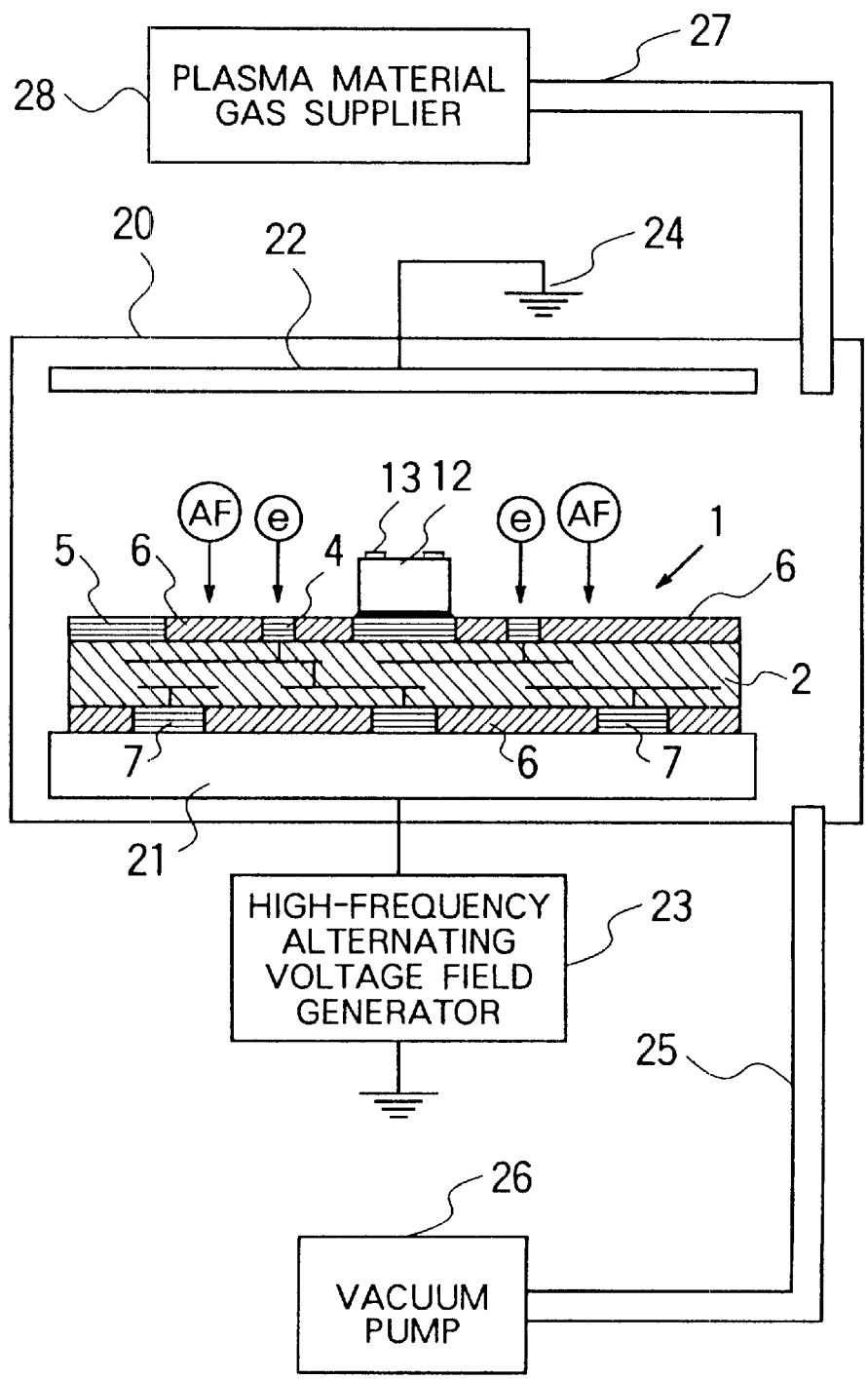
FIG. 6 is a partially cross sectional view showing the substrate in a plasma-etching device.

As shown in FIG. 6, before curing the synthetic resin on the substrate 1, surfaces of the chip mounting portion 3, the front electrodes 4, the metallic layer 5, and the etching-resistant layers 6 are treated by plasma-etching in a plasma treating device 20, in which an upper plasma electrode 22 is electrically grounded to a ground terminal 24, a lower plasma electrode 21 is electrically energized by a high-frequency alternative current supplier 23, a vacuum pump discharges an air and/or gas in the plasma treating device 20 through a vacuum pipe 25, and a plasma material gas, for example, argon gas is supplied into the plasma treating device 2 by a gas supplier 28 through a pipe 27.

In the plasma treating device 2, the plasma material gas becomes plasma in an electric field excited by the lower and upper plasma electrodes 21 and 22, so that the oxide and/or hydroxide is removed by ion of the plasma material gas from the surfaces of the front electrodes 4, the metallic layer 5 and the chip electrodes 13, and the surface of the etching-resistant layer 6 is refreshed or activated.

Figure 7:
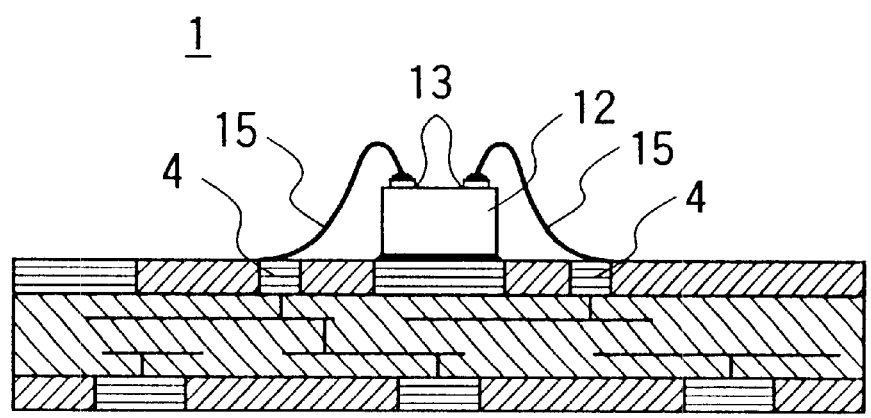
FIG. 7 is a partially cross sectional view of the substrate after connecting electrically through a wire the electronic element chip to an electrode of the substrate.
Figure 8:
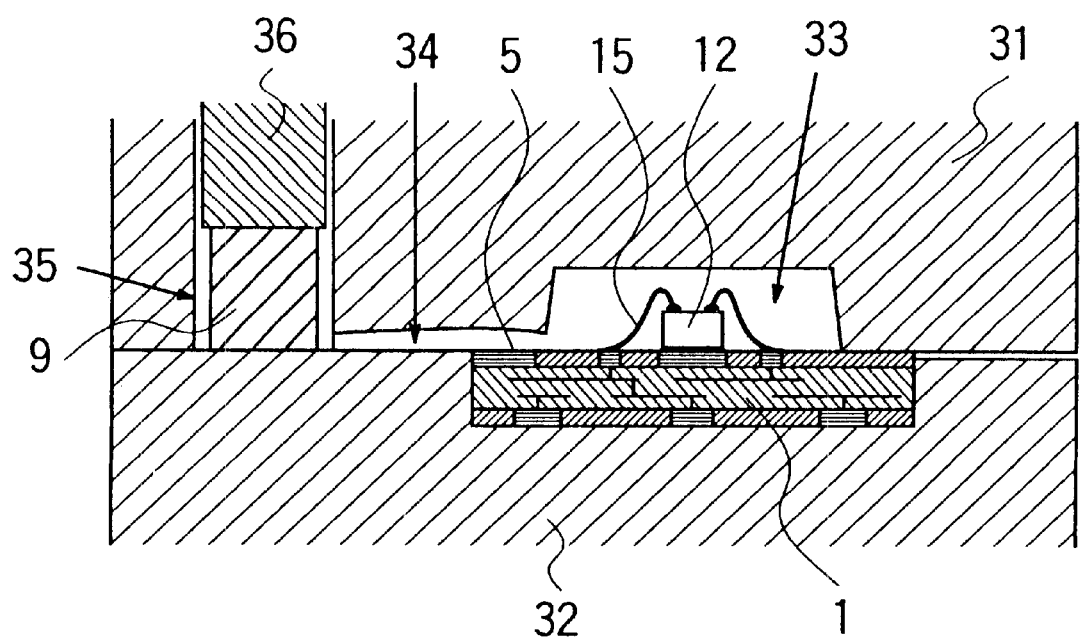
FIG. 8 is a partially cross sectional view of the substrate before covering the electronic element chip with a synthetic resin.
Figure 9:
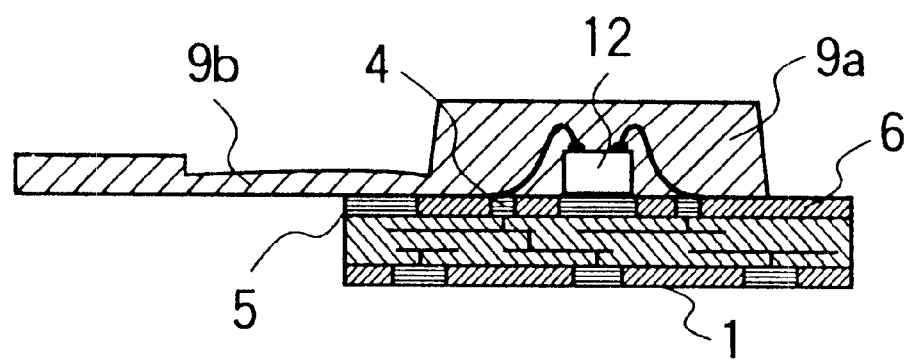
FIG. 9 is a partially cross sectional view of the substrate after curing the synthetic resin.

As shown in FIG. 7, the chip electrodes 13 are connected to the front electrodes 4 by wires 15. As shown in FIG. 8, the substrate 1 with the wires 15 and the electronic element chip 12 is inserted in a cavity 33 formed between an upper mold 31 and a lower mold 32. An uncured synthetic resin injection hole 34 is formed on the metallic layer 5. An uncured or melted synthetic resin generated by heating a synthetic resin 9 in a cylindrical hole 35 is supplied or pressed into the cavity 33 through the uncured synthetic resin injection hole 34 by a plunger 36. After curing the synthetic resin in the cavity 33 to form the synthetic resin cover 9, the upper mold 31 and the lower mold 32 are separated from each other to take out the substrate 1 and the synthetic resin cover 9a as shown in FIG. 9.

Figure 10:
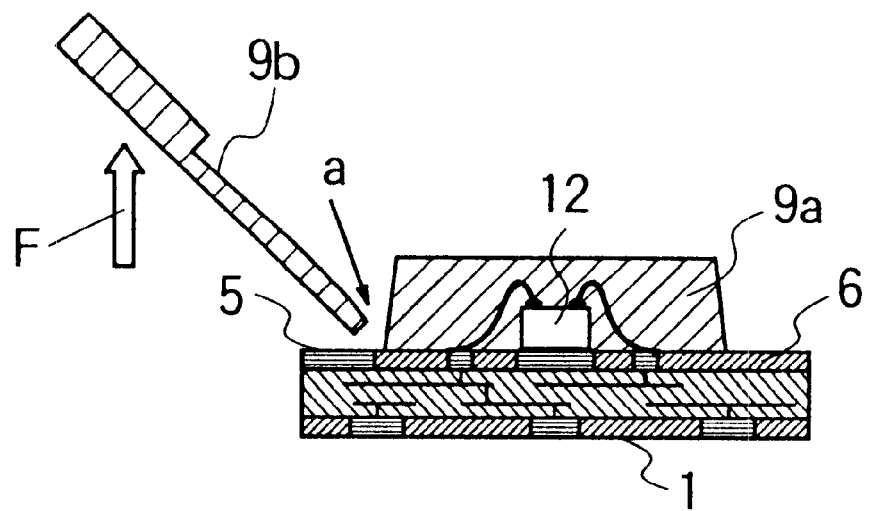
FIG. 10 is a partially cross sectional view of the substrate when the cured synthetic resin is partially removed from the substrate.

An undesirable portion of the cured synthetic resin 9b which extended along the metallic layer 5 is removed from the synthetic resin cover 9a of desirable portion of the cured synthetic resin by a separating force F, as shown in FIG. 10.

Figure 11:
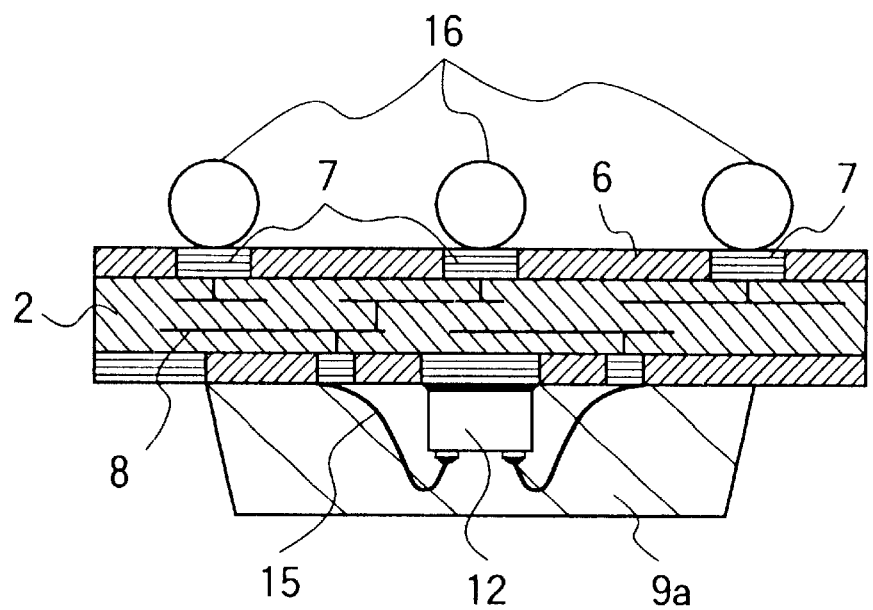
FIG. 11 is a partially cross sectional view of the substrate before joining interface-electrode-balls to the substrate.
Figure 12:
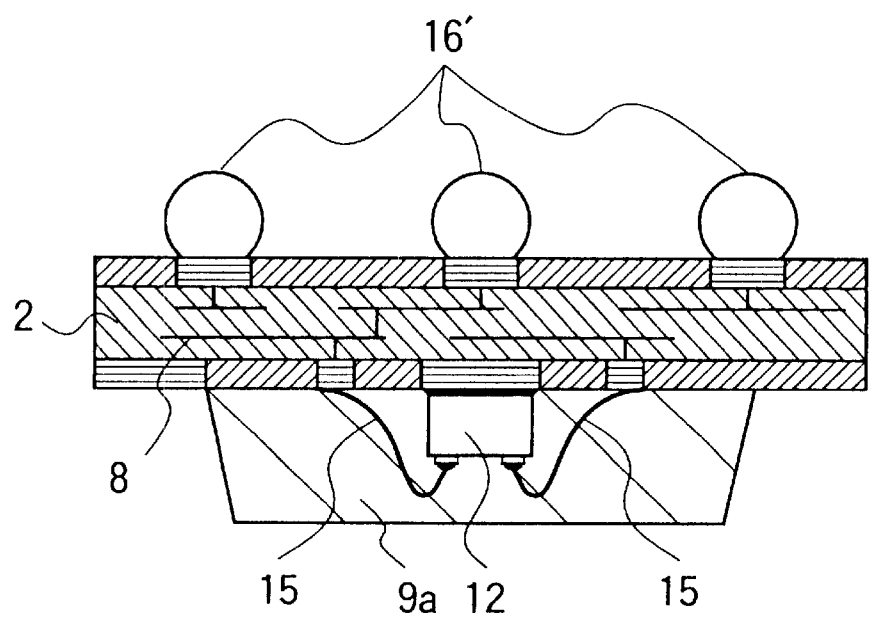
FIG. 12 is a partially cross sectional view of the substrate after joining the interface-electrode balls to the substrate.

The substrate 1 is reversed to mount electrically conductive balls 16 on the back electrodes 7 as shown in FIG. 11. The electrically conductive balls 16 are joined to the back electrodes 7 by being heated, so that the back electrodes 7 have respective projecting terminals 16' as shown in FIG. 12.

Figure 13:
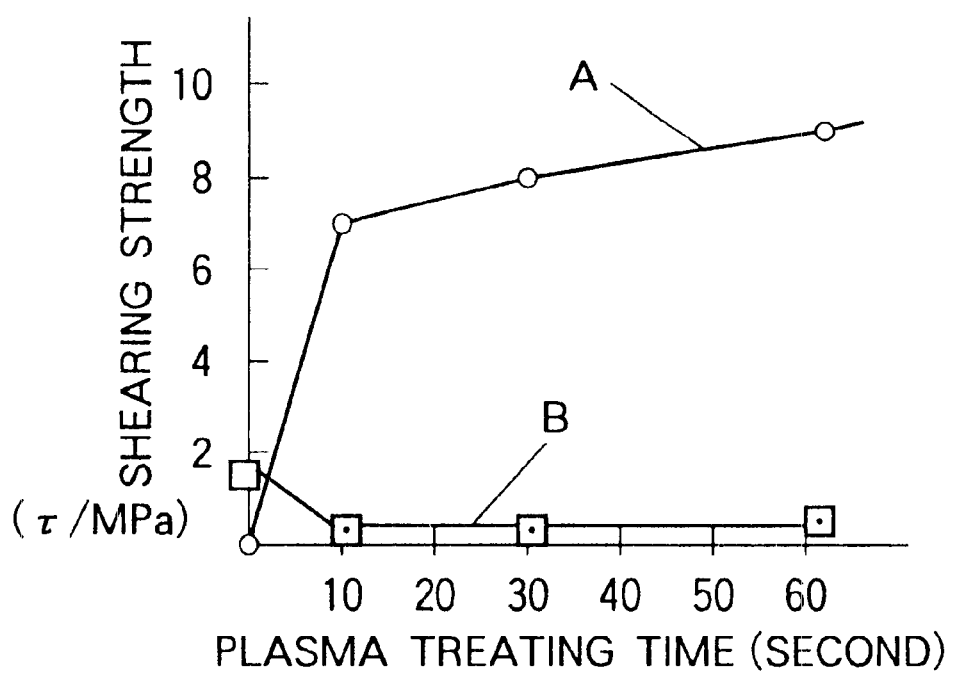
FIG. 13 is a diagram showing a relationship between a plasma-etching time and a strength against shearing separation between the cured synthetic resin and a metallic surface of the substrate, and a relation-ship between the plasma-etching time and a strength against shearing separation between the cured synthetic resin and an etching-resistant surface of the substrate.

As shown in FIG. 13, a strength B against shearing separation between the cured synthetic resin 9b and the surface of the metallic layer 5 is decreased by the plasma etching as described above, and a strength A against shearing separation between the cured synthetic resin 9a and the surface of the etching-resistant layer 6 is increased by the plasma etching as described above. These similar effects A and B are obtained by removal sputtering, but the plasma etching is more preferable. The plasma etching for decreasing the strength against shearing separation between the cured synthetic resin 9b and the surface of the metallic layer 5 and increasing the strength against shearing separation between the cured synthetic resin 9a and the surface of the etching-resistant layer 6 may be performed before mounting the electronic element chip 12, or after connecting the chip electrodes 13 to the front electrodes 4 by the wires 15.

Figure 14:
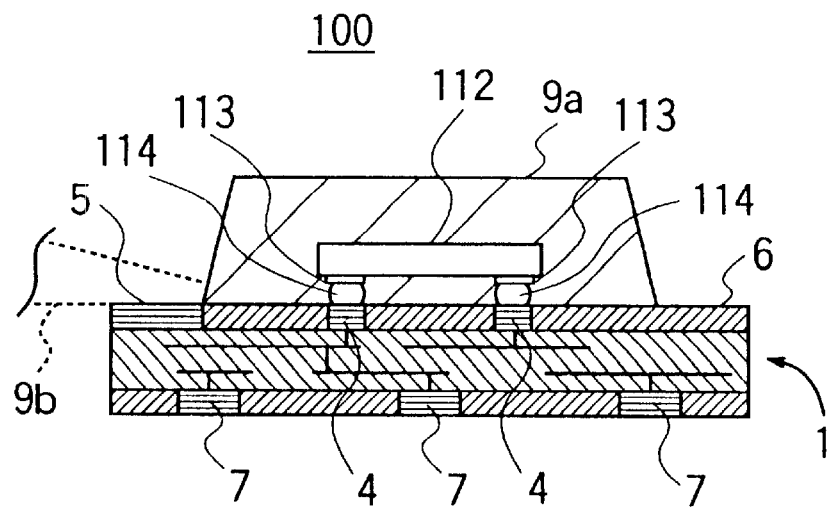
FIG. 14 is a partially cross sectional view of another electric part of the present invention.
Figure 15:
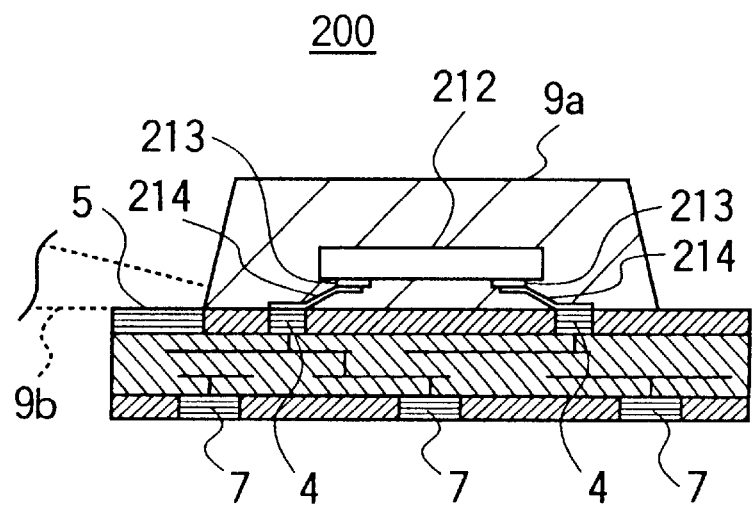
FIG. 15 is a partially cross sectional view of another electric part of the present invention.

FIGS. 14 and 15 show electric parts 100 and 200, respectively, according to further aspects of the invention.

The electronic element chip 12 may be replaced by an electronic element chip 112 whose chip electrodes 113 are connected to the front electrodes 4 by respective projecting terminals 114 made of gold, copper or solder as shown in FIG. 14, or by an electronic element chip 212 whose chip electrodes 213 are connected to the front electrodes 4 by respective electrically conductive plates 214 fixed to the front electrodes 4 through heat-and-pressure welding.

What is claimed is:

1. A method of producing an electric part comprising a substrate and a synthetic resin cover, said substrate comprising a substrate body, an electronic element chip, a chip mounting portion, and a metallic layer, said method comprising the steps of:

(a) mounting said electronic element chip on said chip mounting portion;

(b) treating said metallic layer by at least one of sputter treatment and plasma treatment so as to remove from the metallic layer at least one of oxide and hydroxide, wherein treating the metallic layer occurs at a point in time selected from the group consisting of before mounting the electronic element chip and after mounting the electronic element chip;

(c) applying a synthetic resin to said substrate so as to cover said mounted electronic element chip and said treated metallic layer;

(d) curing said applied synthetic resin; and
(e) removing a portion of said cured synthetic resin in contact with the treated metallic layer so as to provide said synthetic resin cover.

2. A method according to claim 1, wherein the chip mounting portion abuts the metallic layer.

3. A method according to claim 1, wherein the metallic layer is a gold layer whose thickness is less than 0.1 $\mu$m.

4. A method according to claim 1, wherein the electronic element chip is fixed to the substrate body through heating and cooling a bonding element between the electronic element chip and the substrate body.

5. A method according to claim 1, wherein the substrate includes a barrier layer disposed under the metallic layer, and the barrier layer comprises nickel.

6. A method according to claim 1, further comprising, before said step (c), forming on a portion of the substrate other than the metallic layer an etching-resistant layer through at least one of sputter-treatment and plasma-treatment for activating a surface of the etching-resistant layer.

7. A method according to claim 1, wherein at least one of oxide and hydroxide is removed from an electrode of the substrate through plasma-etching, before an electrically conductive member is joined to the electrode and the electronic element chip to connect the electronic element chip to the electrode.

8. A method according to claim 1, wherein the at least one of sputter-treatment and plasma-treatment of the metallic layer is performed before mounting the electronic element chip onto the chip mounting portion.

9. A method according to claim 1, wherein the metallic layer has a thickness of about 0.03 $\mu$m.

10. A method according to claim 1, wherein the at least one of sputter-treatment and plasma-treatment includes at least one of sputter-etching and plasma-etching.

11. A method of producing an electric part comprising a substrate and a synthetic resin cover, said substrate comprising a substrate body, an electronic element chip, a chip mounting portion, an etching-resistant resin, and a metallic layer, said method comprising the steps of:
(a) mounting said electronic element chip on said chip mounting portion;
(b) treating said etching-resistant resin by plasma treatment so as to increase adhesion between said etching-resistant resin and said synthetic resin cover;
(c) treating said metallic layer by plasma treatment so as to remove from the metallic layer at least one of oxide and hydroxide, wherein treating the metallic layer and treating the etching-resistant resin occur simultaneously, and wherein mounting the electronic element chip occurs at a point in time selected from the group consisting of before both treating the metallic layer and treating the etching-resistant resin and after both treating the metallic layer and treating the etching-resistant resin;
(d) applying a synthetic resin to said substrate so as to cover said mounted electronic element chip, said treated etching-resistant resin, and said treated metallic layer;
(e) curing said applied synthetic resin; and
(f) removing a portion of said cured synthetic resin in contact with--the treated metallic layer so as to provide said synthetic resin cover.

12. The method according to claim 11, wherein mounting the electronic element chip occurs before both treating the etching-resistant resin and treating the metallic layer.

13. The method according to claim 11, wherein mounting the electronic element chip occurs after both treating the etching-resistant resin and treating the metallic layer.

* * * * *